United States Patent [19]

Kirby

[11] Patent Number: 4,563,725
[45] Date of Patent: Jan. 7, 1986

[54] ELECTRICAL ASSEMBLY

[75] Inventor: Peter L. Kirby, Newcastle Upon Tyne, England

[73] Assignee: Welwyn Electronics Limited, Northumberland, England

[21] Appl. No.: 566,459

[22] Filed: Dec. 28, 1983

[30] Foreign Application Priority Data

Jan. 6, 1983 [GB] United Kingdom ............... 8300247
Apr. 25, 1983 [GB] United Kingdom ............... 8311200

[51] Int. Cl.$^4$ ............................................. H05K 1/18
[52] U.S. Cl. .............................. 361/388; 174/16 HS; 174/52 FP; 361/386; 361/412
[58] Field of Search ............... 361/398, 386, 387, 388, 361/389, 412, 414; 174/52 FP

[56] References Cited

U.S. PATENT DOCUMENTS

| 3,390,308 | 6/1968 | Marley | 174/52 FP |
| 3,480,836 | 11/1969 | Aronstein | 174/52 FP |
| 3,501,832 | 3/1970 | Iwata et al. | 361/398 X |
| 3,684,818 | 8/1972 | Netherwood | 361/398 X |
| 4,069,497 | 1/1978 | Steidlitz | 361/386 X |
| 4,408,220 | 10/1983 | Calabro | 361/386 |
| 4,415,025 | 11/1983 | Horvath | 361/386 X |

OTHER PUBLICATIONS

C. S. K. Ng, Circuit Module Package, IBM Tech. Discl. Bull., V. 21, #9, Feb. 1979, p. 3591.
Auletta et al., Module Package, IBM Tech. Discl. Bull., V. 18, #11, Apr. 1976, p. 3591.
R. C. Chu, Design for Providing Thermal Interface Material Between Narrow Thermal Interface Gaps, V. 20, #7, Dec. 1977, p. 2761.
Arnold et al., Module with Internal Elements for Reducing Thermal Resistance, IBM Tech. Discl. Bull., V. 21, #4, Sep. 1978, pp. 1473-1474.

Primary Examiner—R. R. Kucia
Attorney, Agent, or Firm—Pollock, Vande Sande and Priddy

[57] ABSTRACT

An electrical assembly incorporates a multilayer printed circuit board comprising a flexible electrically insulating circuit board laminate with electrical conductors for connecting to terminals on rigid slab-like heat-dissipating components such as circuit or component packages or carriers. A separate rigid metallic heat-sinking or spreading plate is applied, having protruding thermally conducting pillars passing through holes in the circuit board laminate to contact the components. A further rigid plate overlies the components and is clamped by clips or bolts to the plate. Compliant means such as springs of deformable and elastic rubber or plastics material is provided intermediate the further plate and the top of the components to accommodate difference in height or thickness between the components while transmitting pressure from the further plate to the top of the component to ensure contact between the components and the pillars on the heat sinking or spreading plate.

26 Claims, 5 Drawing Figures

ELECTRICAL ASSEMBLY

FIELD OF THE INVENTION

This invention relates to an electrical assembly embodying a printed circuit board, particularly of multilayer form, supporting and electrically connecting a multiplicity of rigid slab-like heat dissipating components such as packages or carriers accommodating electronic components or circuits.

BACKGROUND OF THE INVENTION

So-called chip carriers, of ceramic or plastics material, are typically rectangular in shape, incorporating one or more semiconductor chips or dies, electrical connections being provided between the chip or die and multiple conductor terminals on the carrier. The terminals on the package or carrier, which may constitute closely spaced tape leads or metallized areas on the outer surface of the package or carrier, are arranged to be secured and electrically connected, e.g. by solder, to an electrically conductive array on the surface of a planar electrically insulating laminate, interconnections to the array being provided by means of electrical conductor elements, e.g. of copper, arranged at one or more planes within the laminate. With advances in technology it has become necessary to accommodate and electrically interconnect an increasing number of circuit or component packages or carriers on printed circuit boards.

Previously, a much used form of assembling and interconnecting electrical components on a printed circuit board involved mounting the components on a first side of the board with terminal leads inserted through holes in the board and secured and electrically connected by a soldering process to printed copper conductors on a second side of the board. It has more recently become known that a significant saving in the area of the board required to accommodate the necessary components can be achieved if the components are attached onto the surface of the printed circuit board, such that there is no insertion of terminal leads on the components into holes in the circuit board. Examples include the transition from the dual-in-line package to either the leaded or leadless chip carrier and from the conventional cylindrical resistor with axial leads to the leadless rectangular chip resistor. These new components occupy significantly less area than the previous components with leads inserted into the board and call for a technique of 'surface mounting' on to the printed circuit board. Any holes previously incorporated in the board to accommodate inserted leads and also the annular conductor areas which normally surround such holes are superfluous and may be eliminated to the interest of saving space. In addition to providing important economies, this resultant space saving has permitted a greater density of interconnecting elements or tracks of reduced line width and reduced intervening separation on the circuit board. These features are important in achieving economic interconnection of the required larger number of components and enable component or circuit packages or carriers to be employed each embodying a larger number of terminals than previously. Problems have however arisen in mounting chip carriers onto the surface of conventional electrically insulating laminates used for printed circuit boards that are based on a relatively rigid material, such as glass-filled epoxy. It has been found that when terminals on a chip carrier of ceramic material are soldered, or otherwise bonded, to a conductive array on a major surface of the laminate and the resulting assembly subjected to thermal cycling the difference in thermal expansion between the laminate and the chip carrier results in mechanical strain being set up in the regions where the carrier is secured to the laminate, i.e. at the soldered connections. After a number of cycles the connections may fail and the carrier may even become detached from the circuit board. A further problem may also arise in that any flexing or bending forces applied to a circuit board with carriers or packages thereon will give rise to mechanical strain in the connections between the carriers or packages and the laminate and again the connections may fail.

The surface mounting, on printed circuit boards, of a plurality of circuit or component packages or carriers can give rise to the further problem that with high power, and hence heat, dissipation, and with high component density, it may be necessary to introduce appropriate heat sink or spreader means to allow heat to be conducted from the packages or carriers. In previous rigid printed circuit boards it has been proposed to incorporate, as a heat sink or spreader, one or more thermally conducting metal planes in the vicinity of the surface on which the packages or carriers are mounted. In some cases a layer of elastomer may be provided overlying the metal plane or planes to form an electrically insulating surface for supporting the packages or carriers [see K. Smith: "Multilayer PC Board is Friendly Substrate for both Carrier and TAB Packages", Electronics International, Vol. 55, No. 11, at pp. 92–93] and the necessary array of surface conductor elements. This arrangement has the disadvantage that the packages or carriers are not in intimate contact with the heat sink or spreader. A similar disadvantage arises in a further known arrangement [see W. B. Archey, IBM Technical Disclosure Bulletin Vol. 19, No. 2 at page 412 (July 1976)] involving a rigid circuit board and where a cooling plate provided with studs which are coated with a metal loaded elastomer is brought into contact with heat dissipating components which are all of necessity of the same height and have terminal leads extending through holes in the circuit board. Such a metal-loaded elastomer, which is necessary to ensure contact with the components, is of lower thermal conductivity than the cooling plate and therefore results in reduced thermal efficiency. It is also known to fabricate the thermally conducting plane integrally with the circuit board but such that it provides for a direct thermal conducting path to the packages or carriers. However, with these previous arrangements the incorporation of the heat sink or spreader facility into the circuit board during the fabrication of the latter increases the complexity of the manufacturing process. It also imposes a limitation on the thickness of the metal plane which can be adopted for use as the heat sink or spreader with the result that a much less than ideal thickness may have to be employed, with consequent reduced efficiency of operation.

SUMMARY OF THE INVENTION

It is an object of the present invention to overcome or minimize the above disadvantages.

The present invention provides an electrical assembly comprising a multiplicity of rigid slab-like heat dissipating components each mounted against one face of a circuit board by means of interconnections between an array of electrical terminals on said components and electrical conductors on said one face of said circuit board and such that there is no insertion of said terminals into said circuit board, said circuit board being of a flexible material capable of undergoing movement in and out of and within the plane thereof, thereby minimizing or avoiding strain in said interconnections and consequential risk of said components become detached, characterized in that: regions of the circuit board underlying some or all of the components incorporate holes; a plate of thermally conductive material against the other face of the circuit board has heat sink pillars that project through the holes into direct contact with the undersides of the components, flexure and planar extension or compression of the circuit board permitting said direct contact to take place; and means are provided to maintain said heat sink pillars in thermally effective contact with said components.

BRIEF DESCRIPTION OF PREFERRED EMBODIMENTS

The means to maintain the heat sink pillars in thermally effective contact with the components preferably comprises one or more further plates applied on top of the components and secured by clamp means to the said plate of thermally conductive material. If the or each said plate comprises thermally conductive material, it may serve as an additional heat sink or heat spreader. The said pillars may be formed integrally with said plate of thermally conductive material or may be fabricated separately from this plate and secured thereto. The plate of thermally conductive material and pillars suitably comprise a material selected from aluminum, copper, phosphor bronze, beryllium copper or alloys thereof. The further plate or plates suitably comprise(s) a substantially rigid plastics material or a metal or metal alloy.

By providing more than one said further plate on top of the components it is possible to accommodate some arrangements where components of different heights or thickness are provided on the same circuit board. This may not always be practical, however, particularly where components of different heights or thickness are distributed about the surface of the circuit board. One approach to solving this problem might be the provision of a said further plate incorporating recesses of various depths, accurately formed on the basis of the nominal height or thickness of the components, to fit over the tops of the components with the aim of providing the necessary pressure to the top of each component to ensure contact between each component and its associated underlying heat sink pillar. But such a solution would be generally too complex and expensive and would be unsatisfactory from the further aspect in that even for components of nominally the same height or thickness, manufacturing tolerances result in some variation in height or thickness from one component to another. I consider that a better solution of this problem is to provide compliant means intermediate the said further plate and the top of said components, said compliant means being adapted to accomodate any difference in height or thickness between said components while transmitting pressure from said further plate to said components to ensure maintenance of contact by said heat sink pillars with said components, said pressure resulting from application of said clamp means.

The said compliant means may be provided in a number of ways. For example it may comprise a suitably deformable and plastic rubber or plastics material, e.g., silicone rubber. Such a material may be provided in the form of one or more sheets or pads or may be provided by application, e.g. by injection, of a suitably fluid rubber or plastics composition between said further plate and said components, said composition being subsequently caused to set. In a further embodiment, said compliant means may comprise a suitably elastic membrane overlying the components and cooperating with said further plate, the further plate being provided with apertures therein or therethrough in regions overlying the components, said apertures being of larger area than the components, said membrane serving to apply pressure to said components, said components with said overlying membrane being accommodated in part in said apertures in said further plate.

The said compliant means may also comprise one or more resilient members, e.g. spring members. For example coil springs may be provided between the further plate and the top of some or all of the components. If desired, the said coil springs may be provided in recesses in the further plate. It may be preferred to provide the coil springs of conical form to allow compression thereof into a low profile.

Alternatively, leaf springs may be provided between the further plate and the top of some or all of the components. The said leaf springs may be formed out of a sheet of suitably resilient material which is located in contact with the further plate. As an alternative the said leaf springs may be formed integrally with the further plate in which case the further plate will be formed from an inherently resilient or elastic material such as, for example, beryllium copper or phosphor bronze.

The said clamp means may suitably comprise one or more clips, e.g. spring clips, adapted to be applied around said plate of thermally conductive material and said further plate or plates. Alternatively said clamp means may suitably comprise one or more threaded fasteners, e.g. screws or bolts, extending between said plate of thermally conductive material and said further plate or plates.

The said components suitably comprise electric circuit or component packages or carriers. Such packages or carriers, which may conveniently comprise a ceramic or plastics material, may suitably accommodate chips or dies embodying semiconductor integrated circuits.

The said circuit board may particularly be a multilayer printed circuit board comprising a planar electrically insulating flexible laminate, electrical conductor elements, e.g. of copper, being arranged at one or more planes within the laminate to provide electrical connections for the components.

The said flexible laminate has a thickness of not more than 0.75 millimeters and preferably of not more than 0.5 millimeters.

Suitably the flexible laminate comprises a polyimide or a polyester material.

A multiplicity of electrical assemblies of the invention may be arranged in stacked relationship and such that for an overlying assembly in the stack the said plate of thermally conductive material having the heat sink pillars is located on top of the components of an underlying assembly in the stack.

For some applications it may be advantageous to provide a film or layer of additional material intermediate said plate of thermally conductive material and said other face of said circuit board. This additional material, which may, for example, be of a resinous organic or plastics material, and may if desired have adhesive properties can serve, among other things, to prevent undesirable movement of the circuit board under conditions of mechanical vibration. It will not, of course, be provided between the heat sink pillars and the undersides of the components.

The invention is advantageous in several respects.

Firstly, the flexible nature of the circuit board allows it to yield to accept a degree of tension or compression in the plane of its major surface in order to accommodate mismatch in thermal expansion between the components and the circuit board.

Secondly, if the circuit board with the components mounted thereon is subjected to forces which would tend to bend or flex it, the circuit board is able to bend readily and preferentially in the regions between the components and risk of the components becoming detached is minimized or avoided since little or no stresses are imparted to their soldered connections.

Thirdly, since it is possible to secure each component to the conductors on the circuit board such that the underneath surface of each component is exactly the same distance from the surface of the board and since it is also difficult to mount the components such that their underneath surfaces are exactly parallel to the plane of the board, i.e., such that there is no tilt in the mounted components, it might be expected that it would not be possible to achieve good thermal contact between all of the heat sink pillars on the plate of thermally conductive material and the associated components. This would certainly be the case if the circuit board was rigid. I have found however, that with the use of a flexible circuit board, the flexible nature of the board permits it to undergo the necessary contortions when clamped, with the components mounted thereon, between the thermally conductive plate and the further plate, to bring the components into the required state of alignment to optimize their physical contact with the pillars on the thermally conductive plate.

Fourthly, the arrangement of the compliant means intermediate the said further plate and the top of the components provides accommodation for components of different heights or thicknesses.

Fifthly, as the thermally conductive plate with heat sink pillars is formed as a separate add-on component for the circuit board, the complexity of the circuit board fabrication process itself is not thereby increased. Both cost and weight of the assembly are reduced by this approach. The method of attachment of the plate with heat sink pillars such that the pillars are not bonded to the components ensures substantial freedom from stress interchange between the components and the plate with pillars. This may be further enhanced by lubricating the interface between pillars and components with a grease of high thermal conductivity. No mechanical restraint is imposed on either the circuit board or the mounted components and differential thermal expansion or mechanical or thermal stress effects are minimized. Furthermore, the dimensional parameters, such as thickness, of the thermally conductive plate are able to be optimized with respect to the required thermal conduction.

Sixthly, if it should become necessary to replace a faulty component on the circuit board, this is facilitated by the ability to readily separate the thermally conductive plate and the further plate from the circuit board.

Seventhly, the provision of the holes in the circuit board underlying the components facilitates removal of flux residues after solder bonding of components to the circuit board and prior to insertion of the heat sink pillars.

Overall, the invention provides a means for rigidizing a flexible circuit board to provide a readily handleable assembly.

BRIEF DESCRIPTION OF THE DRAWINGS

The invention is now described by way of example with reference to the accompanying drawings in which.

DETAILED DESCRIPTION OF PREFERRED EMBODIMENTS

In the above figures internal parts of heat dissipating components and electrical conductor elements within the circuit board have been omitted. They are well known per se and their inclusion is not required for an understanding of the invention.

Figure 1:
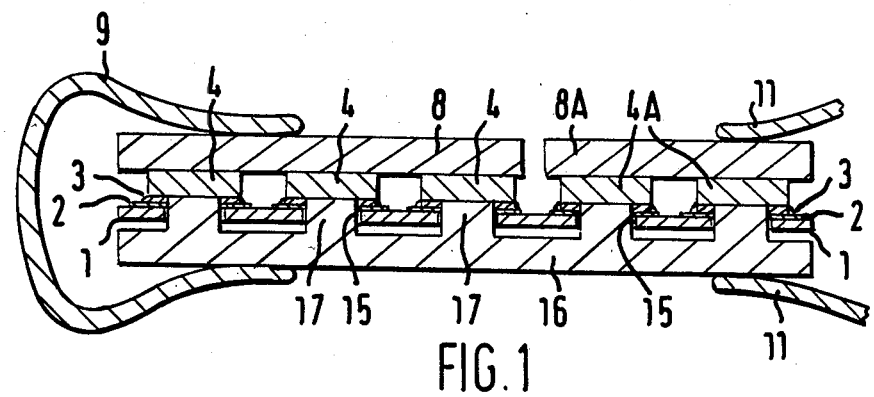
FIG. 1 illustrates a sectional view of an embodiment of an electrical assembly according to the invention.

Referring to FIG. 1, a multilayer printed circuit board is provided comprising a planar electrically insulating laminate 1 of a flexible polyimide material of less than 0.75 millimeters in thickness and usually less than 0.5 millimeters in thickness. A suitable flexible polyimide material is manufactured by E. I. Du Pont de Nemours and Co., under the trade name Kapton (Registered Trade Mark). An electrically conductive array 2 of copper conductors is provided on a major surface of the laminate 1, disposed and arranged to be secured and electrically connected by soldering to multiple conductor terminals 3 on each of a multiplicity of rigid slab like heat-dissipating components 4, such as circuit or component packages or carriers. There is no insertion of terminals 3 into holes through the laminate 1. Components 4 may, for example, be semiconductor chip carriers each comprising one or more semiconductor component or integrated circuit dies or chips accommodated in a carrier housing of ceramic or plastics material. A number of the components 4 may be provided, closely spaced e.g. in rows, on the surface of the laminate. Electrical interconnections for the array 2 are provided by means of copper electrical conductor elements or tracks (not shown) arranged at one or more planes within the laminate, and interconnected by plated through holes of small diameter or by solid pillar vias.

The flexible laminate 1 is provided with a plurality of holes 15 through it such that a hole is formed at some or all locations where the components 4 are secured and connected. A substantially rigid thermally conductive plate 16 suitably of aluminum copper, beryllium copper or phosphor bronze, is fabricated having on a major surface thereof a plurality of upstanding heat sink pillars 17, suitably formed of the same materials as the plate 16. The pillars 17 may be formed integrally with the plate 16 or may be fabricated separately and secured to the plate 16. The plate 16 is applied to the laminate 1 so that the pillars 17 are inserted through the holes 15 in the laminate and contact the underside of the components 4. A further substantially rigid plate 8, also suitably of copper or aluminum, is applied on top of the components 4, and clamp means are provided in the form of a generally c-shaped spring clip 9 whose limbs embrace the plates 8, 16 and urge them together, thereby forming a rigid structure in which the plate 8 and the pillars 17 on the plate 16 are secured in contact with the components 4. Plate 16 together with the pillars 17 and optionally plate 8, serve as heat sinks or spreaders for heat generated in the components 4 when the latter are subjected to electrical load.

The plate 8 may be constructed so as to contact the top of all the components 4, with further clips similar to clip 9 being applied as required. If, however, some components 4A are utilized which are thicker than the other components 4, a separate plate 8A may be provided on top of these components 4A. One or more clips 11, similar in shape and function to clip 9 is or are applied to the plates 16 and 8A in the same way as previously described for clip 9. If plates 8 and 8A need not contribute to the sinking or spreading of heat from the components 4 these plates may be fabricated from suitable rigid non-metallic material.

The successful realization of the above assembly largely depends on the compliant nature of the flexible laminate 1. In practice it is impossible to secure each component 4 or 4A to the array of conductors 2 so that the underneath surface of each component is exactly the same distance from the surface of the laminate 1 and so that the underneath surfaces of the components 4 are exactly parallel to the plane of the laminate 1 and in practice they are attached in slightly tilted attitudes. But when the circuit board with the components 4 thereon is clamped by means of the clips 9, 11 between plate 16 and plates 8 and 8A the laminate 1 flexes so that the components 4, 4A are aligned by compression between the plate 8 and the pillars 17 and make maximum surface contact therewith. The laminate 1 can also accommodate mismatch in thermal expansion which exists between itself and the components 4, 4A connected thereto. The laminate 1 can be moved within its plane as well as out of its plane (i.e. it can be stretched or compressed or undergo buckling) as required and this minimizes the risk of mechanical failure occurring in the soldered interconnections between the terminals 3 on the components 4, 4A and the conductors 2 on the circuit board.

As the surface of each component 4, 4A is not rigidly bonded to the surface of its associated protruding pillar 17 there is no impediment to relative lateral movement between the two and any tendency for the development of strain in the structure due to differential thermal expansion or mechanical stress effects is eliminated. Indeed, it may be advantageous to apply a thin film of a grease with high thermal conductivity (such as Electrolube HTC O10) between the contacting surface of the pillars 17 and the components 4 to improve thermal transfer and this also provides lubrication to facilitate any strain-relieving movement. In has been found that in any case the use of the heat sink or spreader arrangements reduces the temperature of the components in operating conditions and thereby further reduces the tendency for thermal mismatch strains to develop.

The use of a single top plate 8 or discrete rigid top plates 8, 8A to hold the undersides of components 4 in contact with the pillars 17 is satisfactory where all of the components 4 are of the same body height or where components of the same body height are grouped together. In practice, components of different body heights are frequently distributed about the surface of the board 1. Furthermore, even for components of nominally the same height or thickness, manufacturing tolerances can result in variation in height or thickness from one component to another. Consequently, if a rigid plate 8 is applied directly, contact occurs preferentially with the top of the highest or thickest components and lesser contact occurs with some of the other components. In order to ovecome this problem the arrangements shown in FIGS. 2, 3, 4 and 5 may be employed.

Figure 2:
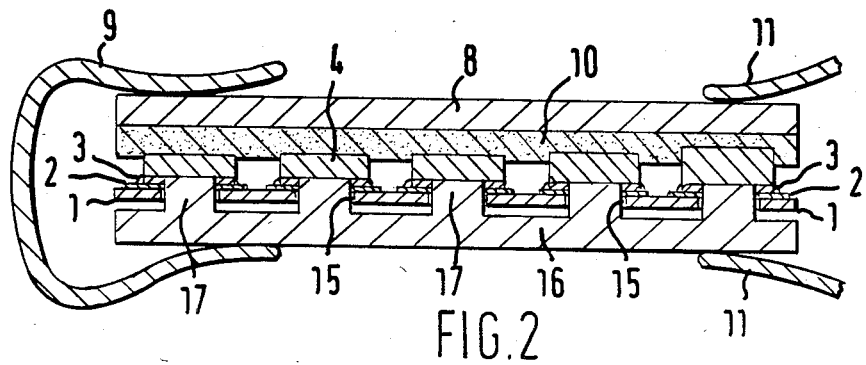
FIGS. 2, 3, 4 and 5 illustrate sectional views of alternative embodiments of an electrical assembly according to the invention, incorporating compliant means of alternative forms.

Referring to FIG. 2, which shows an assembly generally similar to that of FIG. 1, there is introduced between the plate 8 and the top of the components 4 compliant means 10 in the form of a sheet of suitably elastic rubber or plastics material, e.g. silicone rubber. It serves to accommodate difference in height or thickness between the components 4 while transmitting pressure from the plate 8 to the components 4 to maintain them in contact with the pillars 17. The transmitted pressure results from application of the clamp means 9, 11. Instead of inserting a sheet of rubber or plastics material 10, individual pads of this material could be applied at the location of each component 4. Also instead of the sheet or pads, a solidifiable liquid material could be injected between the plate 8 and the components 4 and which after setting will form the equivalent of the sheet 10.

Figure 3:
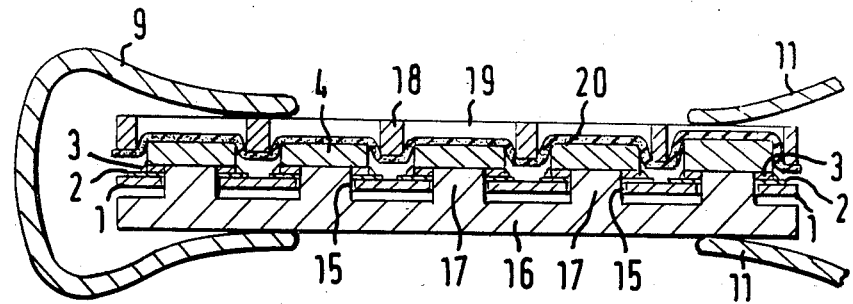

An alternative arrangement is illustrated in FIG. 3. Instead of the further rigid plate 8 shown in FIG. 2, a further rigid plate 18, e.g., of metal or plastics material is provided having apertures 19 in it of larger area than, and directly overlying, the components 4. A thin membrane 20 of suitable elastic rubber or plastics material is applied over the top of the components and when the further plate 18 is applied on top of the membrane 20 and pressure is applied to the assembly by means of the clips 9 and 11, the membrane 20 stretches to accommodate different heights or thicknesses of the components 4 and applies pressure to the top of the components 4 which with the overlying membrane 20 are accommodated in part in the apertures 19 in the plate 18. The extent of such accommodation depends upon the height or thickness of a particular component.

Figure 4:
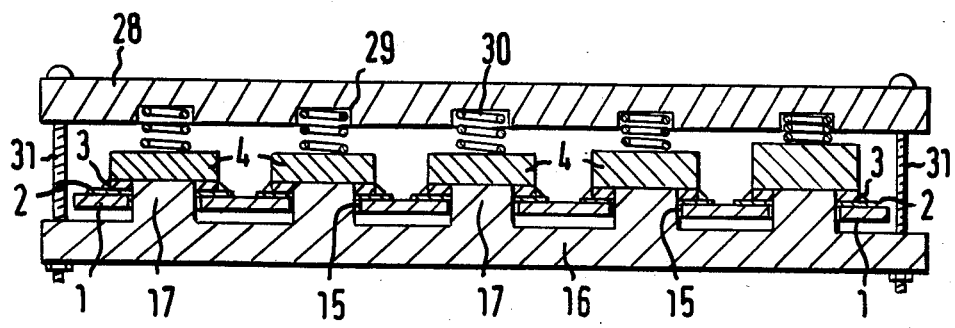

A still further arrangement of compliant means is illustrated in FIG. 4. In place of the rigid plate 8 in FIG. 2, a further rigid plate 28, e.g. of metal or plastics material is provided. Instead of the compliant means comprising sheet 10 as in FIG. 2, compliant means comprising coil springs 30 are provided between the further plate 28 and the top of the components 4. The coil springs 30 may conveniently, but not essentially, be accommodated in recesses 29 in the further plate 28. Clamp means in the form of bolts 31 secure the plate 28 to the thermally conductive plate 16. Pressure is transmitted through the coil springs to the top of the components 4 to ensure that contact is maintained between the components and the metallic pillars 17. The coil springs 30 also serve to accommodate differences in height or thickness between the components 4. If desired the coil springs 30 may be of conical form to allow compression thereof into a low profile.

Figure 5:
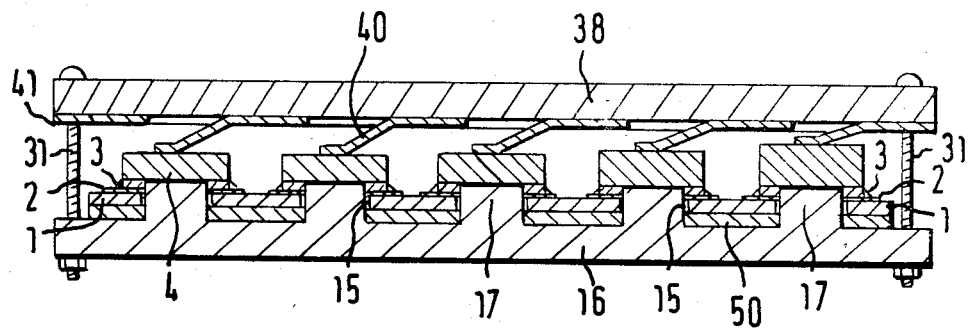

Instead of using coil springs as the compliant means, leaf springs may be used. Such an arrangement is illustrated in FIG. 5. In FIG. 5, leaf springs 40, e.g. of phosphor bronze, or a suitable plastics material, are provided between further rigid plate 38 (compare further rigid plate 8 in FIG. 2) and the top of the components 4. The leaf springs 40 may either be individually secured to the plate 38 or provided integrally with a sheet 41 of the same material as the springs which is located in contact with the plate 38. The leaf springs 40 are conveniently formed by cutting and pressing out from the sheet 41. The leaf springs 40 function in equivalent manner to the coil springs 30 in FIG. 4.

Although bolts 31 are shown as the clamp means in FIGS. 4 and 5, spring clips similar to those shown in FIGS. 1, 2 and 3 (reference numerals 9 and 11) could be substituted instead. Likewise, the bolts 31 in FIGS. 4 and 5 could be substituted for the clips 9 and 11 in FIGS. 1, 2 and 3.

Other arrangements of compliant means are possible wihin the scope of the invention. For example, it could be envisaged that the leaf springs 40 used in the arrangement of FIG. 5 could be combined with an apertured further rigid plate of the kind designated by reference numeral 18 in FIG. 3 to produce an assembly of lower profile than in FIG. 5, the components, with the leaf springs bearing thereon, being partially accommodated in the apertures in the further plate. In a variation on this theme, the leaf springs could be formed integrally with the apertured further plate, the further plate and springs being formed of an inherently resilient or elastic material such as beryllium copper or phosphor bronze, or plastics material.

For some applications it may be advantageous to provide a film or layer 50 (FIG. 5) of additional material intermediate the plate 16 of thermally conductive material and the underside of the printed circuit board laminate 1. This film or layer 50 which may, for example be of a resinuous organic or plastics nature and may, if desired, have adhesive properties, can serve among other things to prevent undesirable movement of the circuit board under conditions of mechanical vibration. Film or layer 50 will not, of course be provided between the pillars 17 and the components 4. Such a film or layer may also be incorporated in the embodiments illustrated in FIGS. 1, 2, 3 and 4.

Electrical assemblies as described above and illustrated in the accompanying drawings may, if desired, be arranged in stacked relationship with one another. In this case the further plate (8, 18, 28 or 38) may be omitted on assemblies within the stack and its function performed by the thermally conductive plate 16. The underside of the thermally conductive plate 16 in an overlying assembly in the stack is arranged to contact the tops of the components 4 in an underlying assembly, or to support the compliant means (10, 20, 30 and 40) which contact the components 4.

I claim:

1. An electrical assembly comprising:
   a multiplicity of chip carriers each containing a chip embodying a semiconductor integrated circuit, said chip being supported in a body of rigid material having a generally planar face with the chip being connected to an array of terminals on said planar face;
   a circuit board of flexible material capable of undergoing movement in and out of and within the plane thereof and provided with electrical conductors on a face thereof;
   soldered joints between the terminals and the electrical conductors mounting said chip carriers against one face of the circuit board without insertion of the terminals into the board and with the flexibility of said circuit board minimizing strain in said interconnections and consequential risk of said chip carriers becoming detached;
   regions of said circuit board underlying said chip carriers defining holes through said circuit board;
   a plate of thermally conductive material against the other face of the circuit board, said plate having heat sink pillars that project through said holes into direct contact with the undersides of said chip carriers while remaining detached from said chip carriers; and
   means urging said chip carriers into thermally effective contact with said heat sink pillars, flexure and planar extension or compression of the circuit board permitting said direct contact to take place and the detachment of said chip carriers from said heat sink pillars permitting strain-releasing lateral movement of said chip carriers relative to said pillars.

2. An assembly according to claim 1 in which the means to maintain the heat sink pillars in thermally effective contact with the chip carriers comprises at least one further plate applied on top of the chip carriers and clamp means secures said further plate to said plate of thermally conductive material.

3. An assembly according to claim 2 in which the said pillars are formed integrally with the said plate of thermally conductive material.

4. An assembly according to claim 1, in which the said plate of thermally conductive material and pillars comprise a material selected from the group consisting of aluminum, copper, phosphor bronze, beryllium copper, and alloys thereof.

5. An assembly according to claim 4 in which each said further plate comprises a material selected from the group consisting of substantially rigid plastics materials, metals and metal alloys.

6. An assembly according to claim 2 in which there is provided compliant means intermediate the said further plate and the top of said chip carriers, said compliant means being adapted to accommodate any difference in height or thickness between said chip carriers while transmitting pressure of said clamp means from said further plate to said chip carriers to ensure maintenance of contact by said heat sink pillars with the said chip carriers, said pressure resulting from application of said clamp means.

7. An assembly according to claim 6 in which said compliant means comprises a material selected from the group consisting of deformable and elastic rubber and plastics materials.

8. An assembly according to claim 7, in which said rubber or plastics material comprises silicone rubber.

9. An assembly according to claim 7 in which said material is provided in the form of a pad overlying each chip carrier.

10. An assembly according to claim 7 in which said material is provided by introducing a suitably fluid composition between said further plate and said chip carriers, said composition being subsequently caused to set.

11. An assembly according to claim 6, in which said compliant means comprises a suitably elastic membrane overlying the chip carriers and co-operating with said further plate, means in said further plate defining apertures therein in regions overlying the chip carriers, said apertures being of larger area than the chip carriers, said membrane serving to apply pressure to said chip carriers, said chip carriers with said overlying membrane being accommodated in part in said further plate.

12. An assembly according to claim 6, in which said compliant means comprises coil springs provided between the further plate and the top of at least some of said chip carriers.

13. An assembly according to claim 12, in which said coil springs are provided in recesses in the further plate.

14. An assembly according to claim 12 in which said coil springs are of conical form.

15. An assembly according to claim 6, in which said compliant means comprises leaf springs provided between the further plate and the top of at least some of the chip carriers, said leaf springs being formed out of a sheet of suitable resilient material which is located in contact with the further plate.

16. An assembly according to claim 6, in which said compliant means comprises leaf springs formed integrally with the further plate, said further plate being formed from an inherently resilient material.

17. An assembly according to claim 16, in which said inherently resilient material is selected from the group consisting of a plastics material, beryllium copper and phosphor bronze.

18. An assembly according to claim 2 in which said clamp means comprises at least one spring clip adapted to be applied around said plate of thermally conductive material and said further plate.

19. An assembly according to claim 2 in which said clamp means comprises at least one threaded fastener extending between said plate of thermally conductive material and each said further plate.

20. An assembly according to claim 1 in which said circuit board is a multilayer printed circuit board comprising a planar electrically insulating flexible laminate, electrical conductor elements being arranged at at least one plane within the laminate to provide electrical connections for the chip carriers.

21. An assembly according to claim 20, in which said laminate has a thickness of not more than 0.75 millimeters.

22. An assembly according to claim 20 in which said laminate has a thickness of not more than 0.5 millimeters.

23. An assembly according to claim 20 in which said flexible laminate comprises a polyimide or polyester material.

24. An assembly according to claim 1 arranged in stacked relationship with at least one like assembly.

25. An assembly according to claim 1, in which a film of additional material of a resinous organic nature is provided intermediate said plate of thermally conductive material and said other face of said circuit board.

26. An assembly according to claim 25, in which said film of additional material has adhesive properties.

* * * * *